(12) United States Patent
Condit et al.

(10) Patent No.: US 8,219,741 B2
(45) Date of Patent: Jul. 10, 2012

(54) HARDWARE AND OPERATING SYSTEM SUPPORT FOR PERSISTENT MEMORY ON A MEMORY BUS

(75) Inventors: Jeremy P. Condit, Redmond, WA (US); Engin Ipek, Redmond, WA (US); Edmund B. Nightingale, Redmond, WA (US); Benjamin C Lee, Redmond, WA (US); Christopher Frost, Los Angeles, CA (US); Doug Burger, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 372 days.

(21) Appl. No.: 12/485,124

(22) Filed: Jun. 16, 2009

(65) Prior Publication Data

US 2010/0106754 A1 Apr. 29, 2010

Related U.S. Application Data

(60) Provisional application No. 61/108,400, filed on Oct. 24, 2008.

(51) Int. Cl.
    *G06F 12/00* (2006.01)
(52) U.S. Cl. ..................................................... 711/103
(58) Field of Classification Search .................. None
    See application file for complete search history.

(56) References Cited

U.S. PATENT DOCUMENTS

| | | | |
|---|---|---|---|
| 6,513,094 B1 | 1/2003 | Magro | |
| 6,564,285 B1 | 5/2003 | Mills et al. | |
| 6,564,286 B2 | 5/2003 | DaCosta | |
| 6,993,679 B2 | 1/2006 | George | |
| 7,085,879 B2 | 8/2006 | Aasheim et al. | |
| 7,424,574 B1* | 9/2008 | Ahrens et al. | 711/114 |
| 7,480,684 B2* | 1/2009 | Bonwick et al. | 707/205 |
| 2003/0135729 A1 | 7/2003 | Mason, Jr. et al. | |
| 2006/0090017 A1 | 4/2006 | Kim et al. | |
| 2007/0083746 A1 | 4/2007 | Fallon et al. | |
| 2007/0128899 A1 | 6/2007 | Mayer | |
| 2007/0136523 A1 | 6/2007 | Bonella et al. | |
| 2007/0233955 A1 | 10/2007 | Luo et al. | |
| 2007/0255891 A1 | 11/2007 | Chow et al. | |
| 2007/0288687 A1 | 12/2007 | Panabaker | |
| 2008/0033952 A1* | 2/2008 | McKenney et al. | 707/8 |
| 2008/0140921 A1 | 6/2008 | Sutardja et al. | |
| 2008/0140957 A1 | 6/2008 | Pattabiraman et al. | |

OTHER PUBLICATIONS

Chao et al., "Mime: A High Performance Parallel Storage Device with Strong Recovery Guarantees", Hewlett Packard, Mar. 18, 1992, revised Nov. 6, 1992, pp. 1-pp. 20.

Everspin Technologies, "A Fast Non-Volatile Ram With Superior Price an D Performance from a Source You Can Trust", 2009, pp. 1-pp. 4.

Kothari et al., "Architecture of a Self-Checkpointing Microprocessor that Incorporates Nanomagnetic Devices", IEEE Transactions on Computers, Feb. 2007, pp. 1-pp. 19.

(Continued)

*Primary Examiner* — Brian Peugh
(74) *Attorney, Agent, or Firm* — Lee & Hayes, PLLC

(57) ABSTRACT

Implementations of a file system that is supported by a non-volatile memory that is directly connected to a memory bus, and placed side by side with a dynamic random access memory (DRAM), are described.

20 Claims, 10 Drawing Sheets

OTHER PUBLICATIONS

Ramtron Internation Corporation, "Technical Advantages of Non-volatile F-RAM Memory in System Design", (@) 2008, p. 1-8.

Sorin, "Using Lightweight Checkpoint/Recovery to Improve the Availability and Designability of Shared Memory Multiprocessors" University of Wisconsin- Madison, retrived at <<http://www.ee.duke.edu/~sorin/papers/thesis.pdf>> 2002, p. 1-140.

Wikipedia, "Phase-Change Memory", retrived at <<http://en.wikipedia.org/wiki/Phase-change_memory>> on Aug. 4, 2009.

* cited by examiner

HARDWARE AND OPERATING SYSTEM SUPPORT FOR PERSISTENT MEMORY ON A MEMORY BUS

RELATED APPLICATION

This application claims priority to U.S. Provisional Application No. 61/108,400 to Condit et al., entitled, "Cache Hierarchy, File System, and Operating System for Byte-Addressable, Non-Volatile Memory," filed Oct. 24, 2008.

BACKGROUND

A traditional computing device directly connects a volatile memory component, such as dynamic random access memory (DRAM), to a memory bus; however, persistent storage devices, including disk and flash, are connected to a slow, low bandwidth input/output (I/O) bus. To achieve acceptable performance, a file system aggressively buffers data in the DRAM at the risk of data loss or file system corruption in the event of a failure (e.g., system crash or power loss). The file system, which may be a part of an operating system, includes responsibility for managing the data on the non-volatile memory.

In an implementation, the file system in the computing device may provide consistency guarantees, temporal safety guarantees, correctness, and performance for data and data accesses stored on a device. The consistency implemented by the file system assures that data stored on a disk has not been corrupted, so that the data may describe a valid file system. The temporal safety may limit an amount of time that the data—once written by an application—resides in the volatile memory before being transferred to the non-volatile memory. In other words, the temporal safety (guarantee) defines the time between a write issued by an application, and the write becoming persistent. The application may include a program designed to perform a specific task such as reading or writing data. The correctness describes whether writes are reflected to persistent storage after the writes were issued by the application. The consistency, the correctness, and the temporal safety may be sacrificed to a certain degree, in order to overcome performance limitations of the persistent storage.

SUMMARY

The following presents a simplified summary in order to provide a basic understanding of some aspects of the disclosed subject matter. This summary is not an extensive overview of the disclosed subject matter, and is not intended to identify key/critical elements or to delineate the scope of such subject matter. A purpose of the summary is to present some concepts in a simplified form as a prelude to the more detailed description that is presented later.

In an implementation, a computing device may include a non-volatile memory that is directly connected to a memory bus (i.e., directly addressable), and placed side by side with a volatile memory. To this end, a file system supported by such a hardware setup may be implemented to improve correctness, temporal safety, consistency, and performance in the computing device, through the use of atomic updates and maintaining the order of writes. The file system may implement a tree structure that allows large amounts of data to be atomically changed.

To accomplish the foregoing and other related ends, certain illustrative aspects are described herein in connection with the following description and the annexed drawings. These aspects are indicative of various ways in which the disclosed subject matter may be practiced, all of which are intended to be within the scope of the disclosed subject matter. Other advantages and novel features may become apparent from the following detailed description when considered in conjunction with the drawings.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Figure 1:
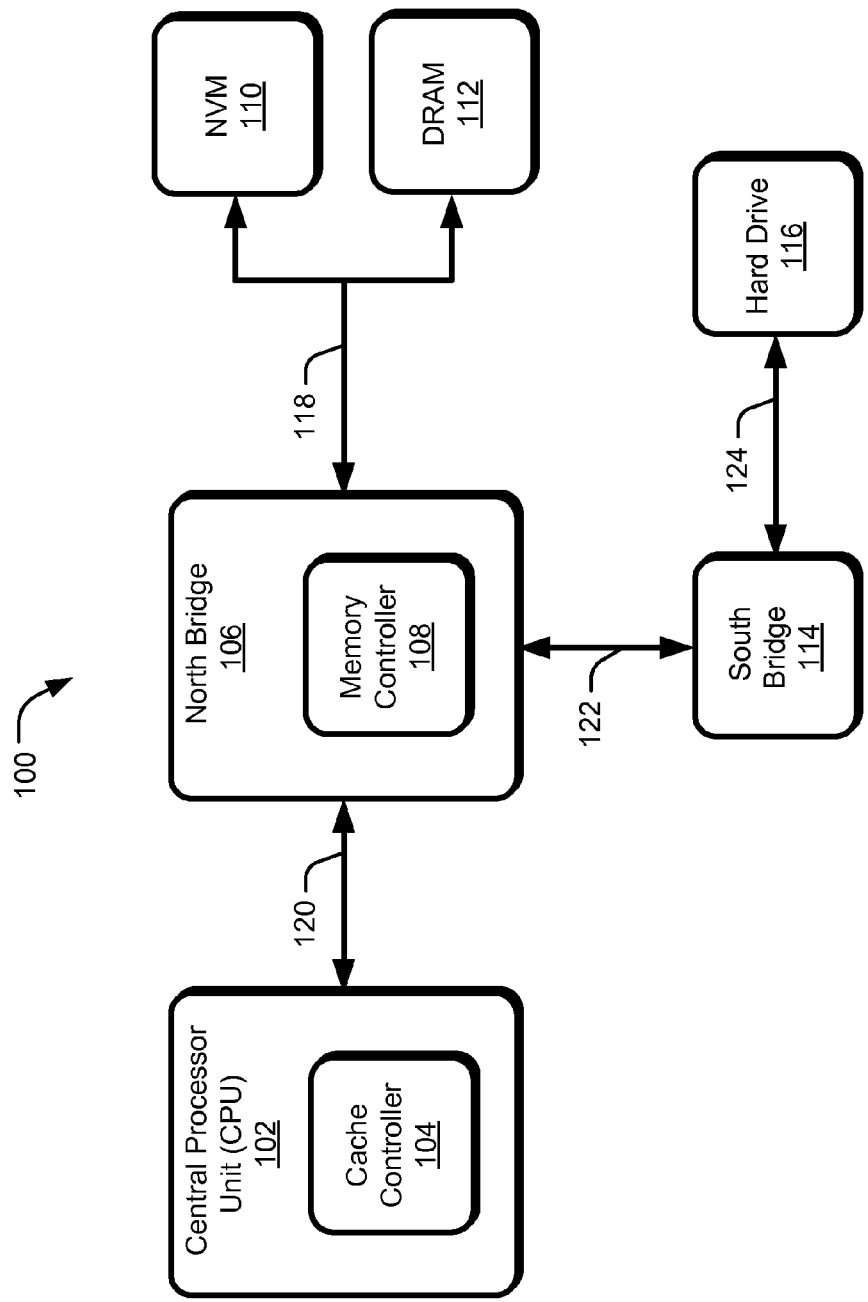
FIG. 1 is a block diagram of an exemplary computing device architecture.

This disclosure is directed towards systems, components, techniques and methods for implementing a byte-addressable, bit alterable persistent data storage (i.e., non-volatile memory) that is directly connected to a memory bus, and placed side by side with a dynamic random access memory (DRAM) component. In an implementation, a phase change memory (PCM) may be the byte-addressable, bit alterable non-volatile memory that is directly connected to the memory bus. In order to address the issues of consistency, safety, correctness, and performance, a file system (which is a part of an operating system) may manage data on the non-volatile memory. The file system may be used to organize the data in the non-volatile memory while improving consistency, safety, correctness, and performance. The improvement may be implemented by the file system through "ordering" and "atomicity" provided in the hardware setup. For example, the "ordering" provided by the hardware setup allows software to declare important ordering constraints between writes to non-volatile memory, ensuring that these writes are not reordered by a cache controller or a memory controller. The "atomicity" may assure correctness and the safety by writing data of a particular size (e.g., 8 bytes) either completely to the non-volatile memory or not at all.

A file system may be utilized with the non-volatile memory component to facilitate consistency and safety guarantees, as well as improved performance relative to disk-based file systems running on the same storage medium. For example, the file system can facilitate reading and writing of its data structures directly from the non-volatile memory component, as opposed to conventional file systems that maintain copies of data structures in volatile memory and then reflect changes to those data structures to non-volatile memory.

Furthermore, an operating system (OS) may utilize the non-volatile memory component to facilitate performing an "instant boot" (of the operating system). In an implementation, the instant boot uses the non-volatile memory component as persistent storage for OS data state. For instance, a snapshot (e.g., memory image) of the DRAM can be taken after the computer has booted and can be stored in the non-volatile memory component. On the next boot, the snapshot can be copied from the non-volatile memory component to the DRAM to facilitate bypassing at least a portion of the boot sequence.

In accordance with various other aspects and embodiments, the non-volatile memory component may be employed to facilitate efficiently updating a file system tree when a block (e.g., data block) in the file system tree is updated; to facilitate employing a fast-append operation to take advantage of any available unused space in a last data block of a file, where an append operation that can fit within an unused portion of a data block can be written directly to that part of the data block, and the file size can be updated atomically in order to commit the change; and/or to facilitate employing a fast copy operation, where a copy-on-write operation can be improved by copying a desired portion of the data (e.g., only copying the data that is to be preserved). In another implementation, the non-volatile memory component is utilized with regard to a set of uses for applications. For example, the non-volatile memory component is utilized to facilitate checkpointing application state, where an application can reflect the state of the application (e.g., heap, stack, registers) directly to the non-volatile memory component. The application can utilize such checkpoints to facilitate reliability and security.

Computing Device Architecture

FIG. 1 is a computing device architecture 100 that includes central processing unit or CPU component 102, cache controller component 104, northbridge component 106, memory controller component 108, non-volatile memory component 110, dynamic random access memory (DRAM) component 112, southbridge component 114, and a hard drive component 116. The CPU component 102 is a control unit in the computing device 100. In an implementation, the CPU component 102 includes the cache controller component 104, and the northbridge component 106 includes the memory controller component 108. In other implementations, the CPU component 102 may be an integrated system that includes the cache controller component 104 and the memory controller 108. During application writes (i.e., writes for which the writes may include specific tasks, such as writing data to implement or execute a program, the computing device 100 implements a file system to assure temporal safety, correctness, consistency, and performance. The file system may manage data in the computing device 100.

The CPU component 102 may include a system that integrates the cache controller component 104 and the memory controller 108. The file system may be implemented by enforcing "ordering" and "atomicity" in a memory system of the computing device 100. The memory system may include the CPU component 102 that may directly access the non-volatile memory component 110. In an implementation, data from the non-volatile memory component 110 may be read into the CPU component 102 without being reflected in the DRAM component 112.

In an implementation, the "ordering" includes a sequence of writes (in a certain order) that are issued by the file system. The computing device 100 stores the sequence of writes temporarily in the cache controller component 104, and then flushes the sequence of writes from the cache controller component 104 into the memory controller component 108 in a different order. In other implementations, the cache controller component 104 and the memory controller component 108 may preserve ordering for certain data writes, ensuring that the data writes are received by the non-volatile memory component 110 in the same order that the data writes were issued by the file system. The file system uses the "ordering" guarantee to enforce safety, consistency, and correctness guarantees. Furthermore, the "ordering" may include modification of the CPU component 102 e.g., using epoch identification (epoch ID), persistence bits, etc. as further discussed below.

The "atomicity" may include atomic write to non-volatile memory component 110 that may either be completed entirely, or not at all. In an implementation, the cache controller component 104 and the memory controller component 108 enforce atomicity for certain data writes, and the file system uses the atomicity to help enforce safety, consistency, and correctness guarantees.

The CPU component 102 includes a device or component (not shown) that interprets and executes instructions (such as writes) issued by an application. The CPU component 102 includes a processor core that may provide the epoch ID. The epoch ID is used as a reference to maintain the "ordering" in the cache controller component 104 and the memory controller component 108. The epoch ID indicates a current epoch that the CPU component 102 is writing to the non-volatile memory component 110. The current epoch includes all writes issued to the non-volatile memory component 110 since the previous epoch boundary, as indicated by the application. Epochs indicate ordering constraints on writes; specifically, the hardware must preserve ordering between two writes that occur in different epochs (i.e., writes in the same epoch may be reordered arbitrarily). In an implementation, the CPU component 102 issues writes to a cache (not shown) in the cache controller component 104 (e.g., CPU component 102 writes "A" to the cache in the cache controller component 104 where "A" is a variable). In turn, the cache controller component 104 stores the data to cache blocks identified by the epoch ID. Subsequently, the cache controller component 104 may perform writes to the memory controller component 108 (e.g., cache controller component 104 writes "A" to memory controller component 108). The transfer and processing of the data from the cache controller component 104 to the memory controller component 108 may be performed according to the ordering indicated by the epoch. The memory controller component 108 may write the data to the non-volatile memory component 110, or to the DRAM component 112. The writes performed by the cache controller component 104 and the memory controller component 108 may maintain "ordering" according to the epoch boundaries given by the application running in the computing device 100.

The cache controller component 104 may include a memory subsystem in which frequently used data values may be duplicated for quick access. The cache controller component 104 includes the cache block that stores content of frequently accessed random access memory (RAM) locations, and addresses where the RAM locations may be stored. The cache controller component 104 also stores the content of non-volatile memory locations. When the CPU component 102 references an address in the non-volatile memory component 110, the cache controller component 104 may verify if the address is held in the cache block. If the address is held in the cache block, then the address (i.e., data) may be returned to the CPU component 102.

The cache controller component 104 implements mechanisms to enforce the "ordering" and the "atomicity" in the computing device 100. As further discussed below, the cache controller component 104 may use persistence bits, epoch IDs, and atomic bits in order to enforce "ordering" within the cache controller component 104.

The northbridge component 106 may include an interface between the CPU component 102, the nonvolatile memory component 110, and the DRAM component 112. In an implementation, the northbridge component 106 is a system that includes the memory controller component 108. The memory controller component 108 may include flexibility of access to the volatile memory (e.g., DRAM component 112) and the non-volatile memory component 110. Data may be accessed at the same time on both components (i.e., non-volatile memory component 110 and DRAM component 112). In addition, the memory controller component 108 may be responsible for differentiating non-volatile component 110 (e.g., PCM) operations from DRAM component 112 operations by handling distinct timing characteristics of both technologies (i.e., non-volatile memory component 110, and DRAM component 112).

In the same manner that the cache controller component 104 implements the mechanism to enforce "ordering" and "atomicity," the memory controller component 108 implements the "ordering" and the "atomicity" during operation. The "ordering" in the memory controller component 108 is implemented by the use of the epoch ID, the persistence bits, and a timing provided by a scheduler component (as discussed below). In an implementation, the scheduler component performs scheduling of writes, or provides the timing in data access within the computing device 100.

In another implementation, for correct operation (using "atomicity"), the memory controller component 108 provides support for atomic writes (i.e., "atomicity") in the file system (or other software components). For example, in case of a power outage or failure, in-flight writes may be either completed in their entirety or fail completely. The in-flight writes may include persistent data in the cache blocks of the cache controller component 104 that were not yet reflected in the non-volatile memory component 110. In an implementation, the atomic writes in the file system are obtained by inserting a capacitor device(s) (not shown) in the memory controller component 108, to assure that there is enough energy to complete a maximum number of write transactions ongoing within a subsystem of the non-volatile memory component 110. As a result, although the memory controller component 108 may fail to issue further commands, in-flight writes within the non-volatile memory component 110 may be guaranteed to complete.

The non-volatile memory component 110 may include a reliable storage system (i.e., handles more memory requests) that does not lose data when power is removed. The non-volatile memory component 110 may be a byte-addressable and bit alterable non-volatile memory directly connected to a memory bus (i.e., memory bus 118) to obtain direct access or exposure to the CPU component 102. The byte-addressability may include the ability of the non-volatile memory component 110 to perform small, random writes as compared to large data transfers in traditional disk or flash. In contrast to non-volatile flash memories operating on coarse blocks (e.g., kilobytes of data), the byte addressability function may improve performance and reduce power costs. The bit alterable function may include data writing in the non-volatile memory component 110 without separate data erasures. In an implementation, a phase change memory (PCM) may be implemented as the non-volatile memory component 110. The non-volatile memory component 110 may support the file system that optimizes the properties of the byte-addressable and bit alterable non-volatile memory component 110. In addition, the file system may exploit small, random writes at a given time in the non-volatile memory component 110. This file system may optimize the use of the small, random writes whenever possible to reduce memory bus traffic and unnecessary writes in the non-volatile memory component 110.

In an implementation, the non-volatile memory component 110 is a type of non-volatile memory that provides non-volatile, byte-addressable storage. Unlike the DRAM component 112, the non-volatile memory component 110 may store data by using resistivity as opposed to electrical charge. The non-volatile memory component 110 may also use some other physical property that allows it to expose byte addressable, bit-alterable persistent storage. In an embodiment, byte-addressable non-volatile memory component 110 simultaneously improves performance and strengthens temporal safety, correctness, and consistency guarantees. Trade-offs that traditional file systems make between these factors (i.e., temporal safety, correctness, etc.) may be based on the properties of hard disks (e.g., hard disk 116), which greatly favor sequential access of large data blocks. With the byte addressable non-volatile memory component 110, a different set of trade-offs in the file system may be explored. The different set of trade-offs in the file system may simultaneously improve the performance and strengthen temporal safety, correctness, and consistency guarantees by enforcing the "ordering" and "atomicity" in the CPU component 102.

The non-volatile memory component 110 and the DRAM component 112 may be directly connected to a memory bus 118. The memory bus 118 may carry data to or from the northbridge component 106. The northbridge component 106 may further connect to the CPU component 102 through a signal path 120. The signal path 120 may carry the data to or from the CPU component 102. In other implementations, the northbridge component 106 is not included in the computing device 100. To this end, the memory controller component 108 may be integrated to the CPU component 102.

The DRAM component 112 may be used for the heap and the stack to further protect lifetime wear of the non-volatile memory component 110. In addition, the use of the DRAM component 112 (i.e., for the heap and the stack) may provide power reduction consumption in the computing device 100. The heap may include a portion of memory reserved for a program to use for the temporary storage of data structures whose existence or size cannot be determined until a program/application is running. The stack may store data such as procedure and function call addresses, passed parameters, and sometimes local variables.

The southbridge component 114 may include an interface that connects the northbridge component 106 and I/O devices such as hard drive component 116. The southbridge component 114 may pass data to or from the northbridge component 106 through a signal path 122. At the other side of the southbridge component 114 is the hard disk component 116. Although the hard disk component 116 is shown, other implementations may use different devices or no devices at all. The hard disk component 116 may be a non-volatile storage device that stores digitally encoded data. In an implementation, the hard disk component 116 passes or receives data through a signal path 124 that is connected to the southbridge component 114. This data may subsequently be accessed through the signal path 122 by the northbridge component 106.

Central Processing Unit

Figure 2:
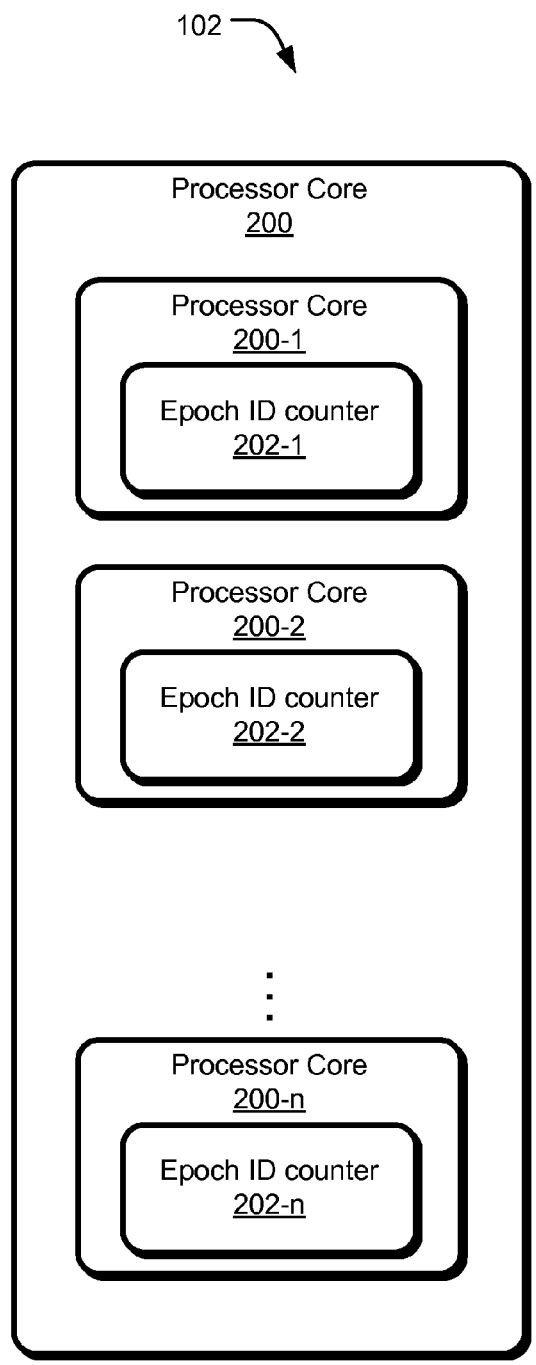
FIG. 2 is a block diagram of an exemplary control processing unit (CPU).

FIG. 2 is an exemplary implementation of a central processing unit (CPU) component 102 (FIG. 1) that includes processor cores 200-1, 200-2, . . . , 200-n (hereinafter referred to as processor core 200), and epoch ID counters 202-1, 202-2, ... 202-n (hereinafter referred to as epoch ID counter 202). The processor core 200 may include an electronic circuit that can execute write operations (writes). To maintain ordering among writes, each processor core 200 may use an epoch ID counter 202 that provides an epoch ID used as a reference to enforce ordering in the non-volatile memory component 110. The epoch ID may indicate the writes that the processor 200 may be writing to the non-volatile memory component 110. The epoch ID may be supplied to the cache controller component 104, and the memory controller component 108, in order to detect and prevent ordering violations. As discussed further below, the epoch ID may be used by the file system to enforce the ordering that is supported by the computing device 100.

In an implementation, the epoch ID counter 202 may be incremented by one (1) each time the processor core 200 encounters a memory barrier that marks the end of the epoch ID. To this end, the epoch ID may allow the file system (as further discussed below) to detect a write that may be safely reordered (because of the memory barrier). When the write commits to any address in the cache controller component 104, the write may be tagged with the value of the epoch ID provided by the epoch ID counter 202. The value of the epoch ID may be propagated with the write throughout the cache controller component 104 and memory controller component 108 to enforce the ordering.

Cache Controller Component
Ordering

Figure 3:
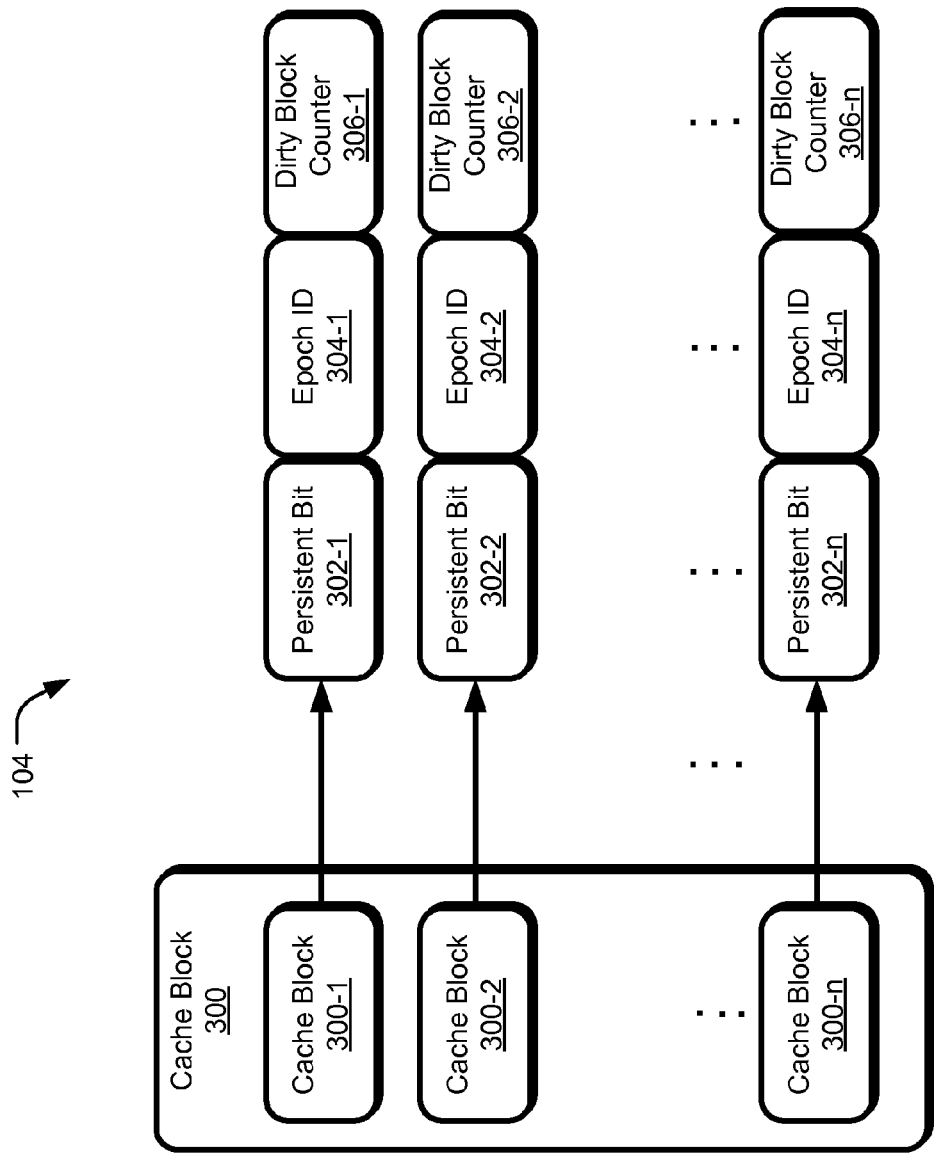
FIG. 3 is a block diagram of an exemplary cache controller.

FIG. 3 is an exemplary implementation of a cache controller component 104 (FIG. 1). Caching persistent data may increase performance because the non-volatile memory component 110 writes slower than the cache controller component 104. In addition, since non-volatile memory component 110 cells may sustain a limited number of writes before wearing out, reducing write traffic through caching of the persistent data may extend the lifetime of the non-volatile memory component 110. The cache controller component 104 may include a cache block component 300 that stores data in cache blocks 300-1, 300-2, ... and 300-n (hereinafter referred to as cache block 300).

Each cache block 300 (e.g., cache block 300-1, 300-2, 300-n) may be associated respectively with persistence bits 302-1, 302-2, ... 302-n (hereinafter referred to as persistence bit 302). The persistence bit 302 (or vector bit) may be set appropriately at the time the cache block 300 is filled based on cache block's address. The persistence bit 302 may be used to identify the cache block 300 data referenced to the non-volatile memory component 110 address ranges. In other words, if the cache block 300 (e.g., cache block 300-1) includes the data to be written into the non-volatile memory component 110, then the persistence bit 302 may be required to identify the cache block 300 that contains the data (i.e., persistence bit is equal to one). Otherwise, the persistence bit 302 may not be required to be associated with the cache block 300 (i.e., persistence bit is equal to zero), if the data may be referenced to the DRAM component 112.

Epoch IDs 304-1, 304-2, ... 304-n (hereinafter referred to as epoch ID 304) may include a defined memory barrier (for each epoch ID 304) as provided by the epoch ID counter 202 in the CPU component 104. In an implementation, the epoch ID 304 is used to identify the cache block 300 when the persistence bit 302 is set to one. In other words, the data in the epoch ID 304 may be referenced to the non-volatile memory component 110. For a given epoch ID 304 (e.g., epoch ID 304-1), the epoch ID 304 may include one or more persistent data that were not yet reflected to the non-volatile memory component 110. This epoch ID 304 may be referred to as in-flight epoch ID 304. The one or more dirty persistent data in the in-flight epoch ID 304 may be tracked by a dirty block counter 306. The dirty counter 306 may include dirty counters 306-1, 306-2, ... 306-n (hereinafter referred to as dirty block counter 306) that may be associated respectively with the in-flight epoch ID 304 to implement the ordering in the cache controller component 104.

In another implementation, the dirty block counter 306 may track the oldest in-flight epoch ID 304 resident in the cache block 300 at each point in time. In a first in first out (FIFO) buffer, the oldest in-flight epoch ID 304 may include the data that were written or entered earlier. The dirty block counter 306 may be incremented, whenever the data is updated (i.e., a new write application provides a new data), and the dirty block counter 306 may be decremented when the dirty persistent data is reflected to the non-volatile memory component 110. When the dirty block counter 306 associated with the oldest in-flight epoch ID 304 reaches a zero value, then the cache controller component 104 may perform an update in the dirty block counter 306 for the oldest in-flight epoch ID 304 in the cache block 300.

In another embodiment, the cache controller component 104 performs an update to the oldest in-flight epoch ID 304 in the cache block 300. At each point in time, any of the in-flight epoch ID 304 that are younger than the oldest in-flight epoch ID 304 in the cache block 300 may not be replaced. To this end, a replacement is performed in a manner that respects ordering in the cache block 300.

Addresses mapped to the DRAM component 112 and persistent blocks from the oldest epoch in the cache block 300 may all be eligible for replacement. If the cache controller component 104 does not find the persistent blocks for replacement, then the cache controller component 104 may attempt to replace the oldest in-flights epoch ID 304 in the cache block 300. To this end, all of the earlier in-flight epoch ID 304 may be flushed from that level of cache hierarchy first, and in program order.

Memory Controller Component
Ordering

Figure 4:
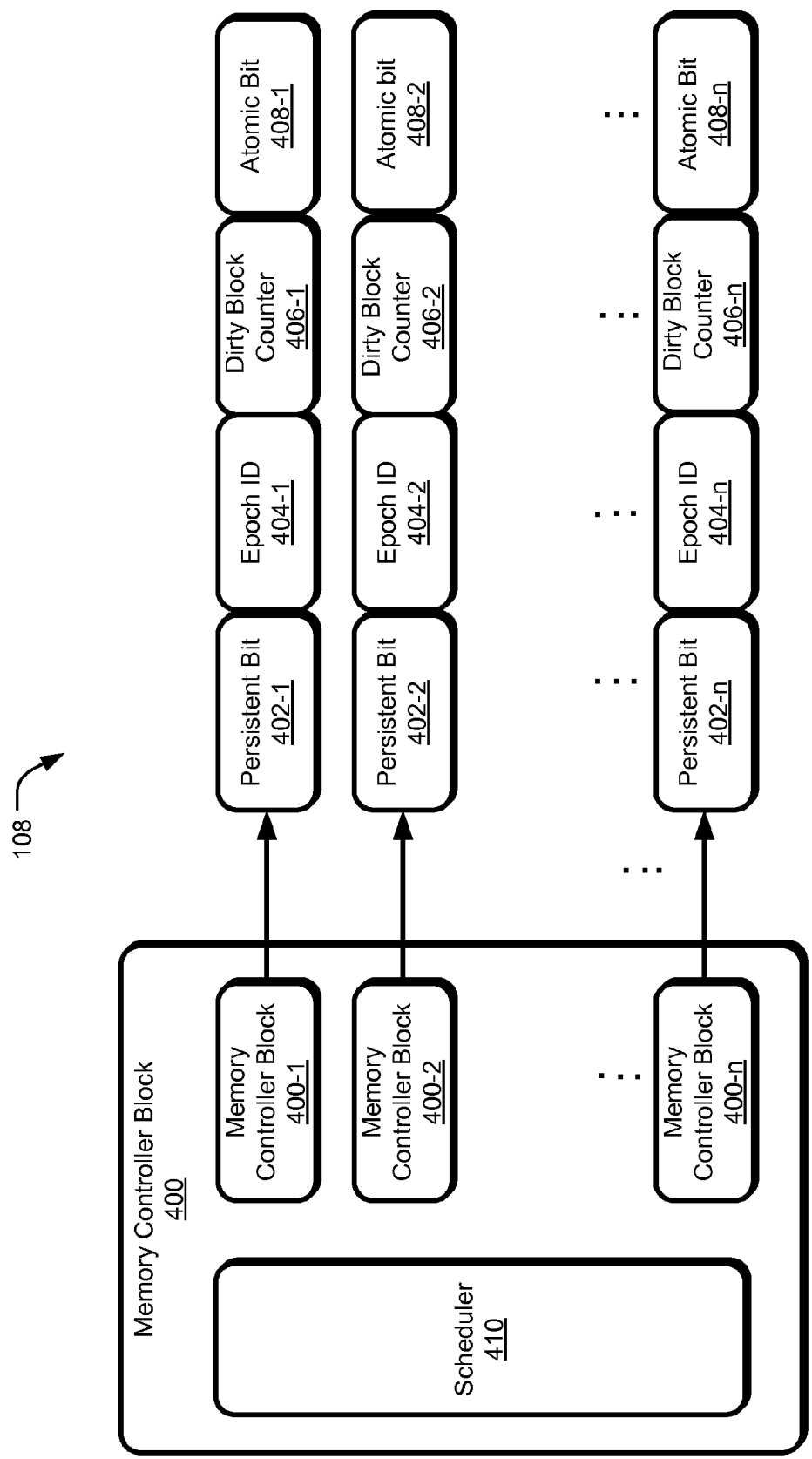
FIG. 4 is a block diagram of an exemplary memory controller.

FIG. 4 is an exemplary implementation of a memory controller component 108 (FIG. 1). A memory controller block 400 may include memory controller blocks 400-1, 400-2, ... and 400-n (hereinafter referred to as memory controller block 400) that may contain metadata. The memory controller block 400, following the cache block 300, may be respectively associated with persistence bit 402 (i.e., persistent bits 402-1, 402-2, ... 402-n), epoch ID 404 (i.e., epoch IDs 404-1, 404-2, ... 404-n), dirty block counter 406 (i.e., dirty block counters 406-1, 406-2, ... 406-n), and atomic bits 408 (i.e., atomic bits 408-1, 408-2, ... 408-n).

In an implementation, the memory controller component 108 may assure that a write (e.g., dirty data) may not be reflected to the non-volatile memory component 110 (e.g., PCM) before in-flight writes associated with all of the earlier epochs are performed. As such, the memory controller component 108 may record the epoch ID 304 associated with each persistent write in the memory controller's transaction queue, and maintain a count of the in-flight writes from each epoch that is queued up at a given point in time (i.e., by using the dirty counter block 406). The persistence bit 402, the epoch ID 404, and the dirty block counter 406 may include the same functions and operations as the persistence bit 302, the epoch ID 304, and the dirty block counter 306, which were discussed under the cache controller component 104. In another implementation, among persistent writes, only those persistent writes associated with the oldest epoch (e.g., in epoch ID 404) may be eligible for scheduling in the memory controller component 108 at any point by a scheduler component 410.

The memory controller block 400 may further include scheduler component 410 that provides the timing through scheduling of writes. The scheduler component 410 may be used in the memory controller block 400 to guarantee correctness by following the program order to enforce ordering in the cache controller component 104. The scheduler component 410 may further support the enforcement of the ordering by the file system (or other software components) through integrated access (i.e., at the same time) of the non-volatile memory component 110, and the DRAM component 112. Since the memory controller block 400 follows a queue of requests from the cache block 300, the scheduler component 410 assures that the writes cannot be reflected in the non-volatile memory component 110 before in-flight writes with all of earlier epochs are performed. The queue of requests from the cache block 300 may include flushing out data information (i.e., deleting information) received by the memory controller component 108 according to the timing as designed in the file system. The timing implemented by the scheduler component 410 may include an added state for tracking of the persistence bit 402 and the epoch ID 404. The timing, persistence bit 402, and the epochs ID 404 may be referred to as restraints (or conditions) used to enforce ordering in the file system.

Atomicity

The atomicity may be enforced at the memory controller component 108 to assure safety and correctness guarantees during enforcement of the "ordering". To prevent data corruption during unexpected failures, the file system atomically updates certain memory location in the non-volatile memory component 110. In an implementation, in case of a power outage or failure, in-flight writes must be either completed in their entirety or must fail completely, and not update the non-volatile memory component 110. In certain implementations, a capacitor device (not shown) may be inserted in the memory controller component 108. The capacitor device may hold enough energy to complete the maximum number of write transactions ongoing within the non-volatile memory component 110.

In another implementation, atomic persistence writes in the memory controller component 108 are provided via hardware journaling. In other words, a write to a predetermined address may signal to the memory controller component 108 that the next write in the program order may be performed atomically. The hardware journaling may be implemented using the atomic bit 408 associated to further identify each memory controller block 400. The atomic bit 408 may provide a timing of the atomic write in the program order in the memory controller component 108. The atomic bit may be propagated throughout the cache controller component 106, and may be interpreted appropriately by the memory controller component 108.

Design Principles for a Non-Volatile Memory File System

Using the non-volatile memory component 110 instead of a hard drive 116 may provide performance benefits based on the speed of the non-volatile memory component 110. The non-volatile memory component 110 also provides an opportunity to further improve both performance and reliability by designing a non-volatile memory file system (PFS) optimized for the unique properties of the byte-addressable, non-volatile memory component 110.

The PFS may be based on three design principles. The first design principle is to exploit small, random writes. Instead of writing large blocks of data at a time, PFS is optimized to use small, random writes whenever possible, to reduce memory bus traffic and unnecessary writes to the non-volatile memory component 110.

The second design principle is to avoid using the DRAM component 112 for file system data and metadata. Instead, PFS stores data and metadata in the non-volatile memory component 110. This frees the DRAM component 112 for other uses, and provides the opportunity to reduce power consumption by reducing the amount of the DRAM component 112 required by the computer device architecture 100. Furthermore, the operating system does not need to manage two tiers of storage, which simplifies the task of ensuring reliability.

The third design principle is to rely on hardware assistance to implement guarantees. Since the non-volatile memory component 110 provides the opportunity to eliminate the layer of the DRAM component 112 between the CPU component 104 and persistent storage, interposing on application operations to enforce ordering or safety guarantees could impede performance. Therefore, the PFS is designed on the premise that hardware enforces the ordering and temporal safety guarantees of data written into the CPU cache. PFS uses write barriers to denote the required ordering between sets of operations and to mark certain writes as atomic. The underlying cache controller component 104 and memory controller component 108 are then free to issue writes between two write barriers in any order while still preserving consistency guarantees.

The above design principles, coupled with the architectural design for the non-volatile memory component 110, allow for the design of a file system that provides strong consistency, correctness, and temporal safety guarantees. PFS provides a strong consistency guarantee by assuring that a crash or power failure will not result in a corrupted file system image. PFS also provides a strong correctness guarantee by leveraging architectural support to reflect application writes to the non-volatile memory component 110 atomically and in the order they were issued by the application. Finally, PFS may improve temporal safety guarantees by reducing the window of vulnerability for data loss from seconds to the number of cycles required make data persistent in PRAM.

A File System Layout for Non-Volatile Memory

In an embodiment, file system data and metadata may be stored in a tree structure in the non-volatile memory component 110, accessible from a root pointer stored at a predetermined location. Consistency is assured throughout the file system by performing intermediate operations in unused portions of the non-volatile memory component 110 and then using an atomic operation to commit them. For example, when changing a page of user data, PFS copies the existing user data to a freshly allocated block of the non-volatile memory component 110, updates the new block, and then atomically overwrites the pointer to the old block with the pointer to the new block. In many cases, updates can be done entirely in-place through careful ordering of writes. In an embodiment, PFS marks epoch boundaries before and after each 64-bit "commit" of file system state, which assures that the committing operation will be written to the non-volatile memory component 110 only after the write operations upon which the committing operation depends have been made persistent.

As a result, there is a very strong consistency guarantee: all file system operations are either committed completely or not at all. In addition, there are strong safety guarantees. Since updates can be applied to the non-volatile memory component 110 synchronously, data will arrive in the non-volatile memory component 110 in the time it takes to flush the cache.

Since most common file operations can be performed in-place, high performance gains may be achieved.

In an embodiment, persistent data structures within PFS include at least three kinds of files. First, an inode file is a single file containing an array of fixed-size modes, each uniquely representing a file or directory in the file system. The root of the inode file represents the root of the file system as a whole, and this root pointer is stored in a predetermined location in the non-volatile memory component 110. Inodes contain file metadata including the root pointer and size of the associated file. An entry in the inode file is only considered valid if it is referred to by a valid directory entry. Second, directory files contain an array of directory entries that include an inumber (i.e., the index of an inode in the inode file) and the name of the corresponding file. Directory entries are only considered valid if they contain a non-zero inumber. Third, data files contain user data only.

Figure 5:
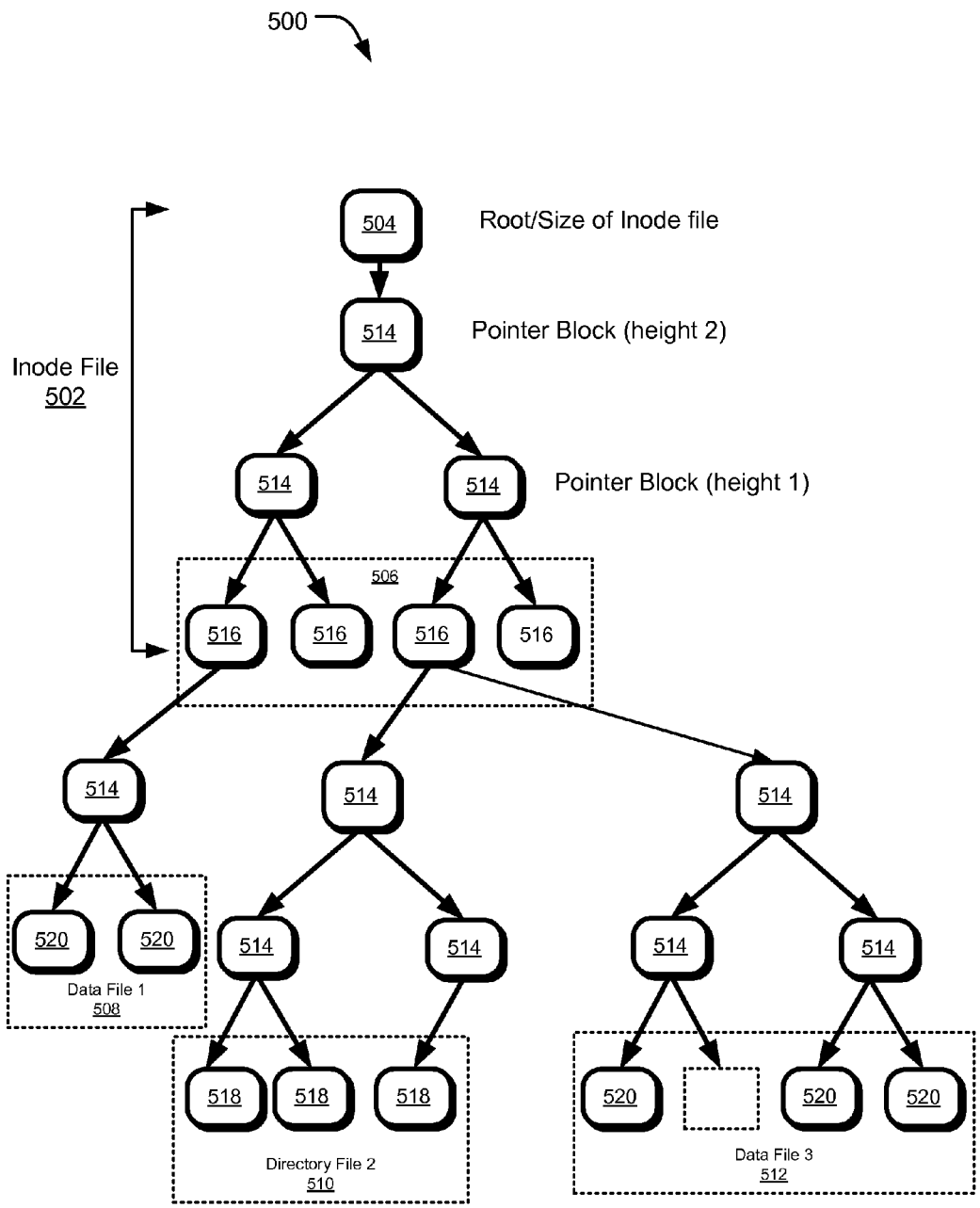
FIG. 5 is a block diagram of an exemplary non-volatile memory file system structure.

FIG. 5 is an exemplary block diagram 500 of the non-volatile memory component 110 (FIG. 1) file system structure. The top half of the file system is the inode file 502, which starts from a root pointer 504 at a predetermined location. The dashed box shows the "data" for the inode file 502, which includes an array of modes 506. Each inode points to a directory file or a data file. FIG. 5 shows three such files, whose data is also stored in a hierarchical structure.

In an embodiment, each kind of file is represented with the same basic data structure: a tree consisting entirely of, e.g., 4 KB blocks. The leaves of the tree represent a file's data (i.e., user data, directory entries, or modes), and the interior nodes of each tree contain 512 64-bit pointers to the next level of the tree. In FIG. 5, the leaves of each file are shown in a dashed box; taken in sequence, the blocks in this dashed box represent the file's contents. For simplicity, only two pointers per block are shown.

The height of each tree is indicated by the low-order bits of the root pointer 504, which allows the file system to determine whether a given block is an interior (pointer) block or a leaf (data) block by remembering the number of hops taken from the root pointer 504. For example, with a tree of height of zero, the root pointer 504 points directly to a data block which can contain up to, e.g., 4 KB of file data. With a tree of height one (1), the root pointer 504 points to an interior block of 512 pointers, each of which points to a 4 KB data block, for a total of, e.g., 2 MB. A tree of height three (3) can store 1 GB of data, and a tree of height 5 can store, e.g., 256 TB of data. It is to be noted that a given tree is of uniform height. For example, if a tree has height of three (3), then all file data will be found three hops down from the root pointer 504, and no file data is stored at interior nodes. It is also noted that because the root pointer 504 and its height are stored in one 64-bit value, they can be updated atomically.

At any level of the tree, a null pointer represents zero data for the entire range of the file spanned by that pointer. For example, if the root pointer 504 is a null pointer with height five (5), then it represents an empty (i.e., zeroed) 256 TB file. Null pointers can also appear at interior nodes, so a write to the end of this 256 TB file will not cause us to write 256 TB of zeros; rather, it will result in a chain of five pointers down to a single data block, with null pointers in the remainder of the interior nodes. Thus, the file representation can achieve very compact representations of large, sparse files.

Trees can have varying height. For example, data file 1 508 has height one (1), directory file 2 510 has height 2, and data file 3 512 has height three (3). Data blocks may be at the same level of each tree. For example, in directory file 2 510, the third data block is still located three hops from the root, even though the parent of the third data block only has one pointer.

It is noted that data file 3 512 is missing a second block due to a null pointer in the parent—this block is assumed to be entirely zero. Components of the tree can store pointers 514, file metadata 516, directory information 518, or user data 520.

The size of each file is stored along with each root pointer. For the inode file 502, the file size is stored in a predetermined location (root node 504). For all other files, the file size is stored in each file's inode next to the root pointer 504. If the file size exceeds the amount of data encompassed by the current tree height, then the tail of the file is assumed to be zero. Therefore, the 256 TB zero file may also be represented by a tree of height of zero (0) and a file size of 256 TB. If the file size is less than the amount of data represented by the current tree height, then data in the tree beyond the end of the file is ignored and may contain garbage. For example, if a tree has a height 1 (with a maximum of 2 MB) and a file size of 1 MB, then the first 256 pointers of the interior node point to valid data, and the last 256 pointers are ignored and may contain arbitrary bits.

In an implementation, persistent data can be updated in three ways: in-place updates, in-place appends, and partial copy-on-write. These approaches to updating data represent distinct advantages over disk-based file systems, which are not able to modify persistent storage at a byte granularity.

Updating Persistent Data Via In-Place Update

In-place updates are an efficient approach. In an embodiment, for data files, in-place updates can be performed for writes of 64 bits or less, since the hardware guarantees that these updates are atomic. The file system can be built around any granularity of atomic writes. For the purposes of discussion, we will assume an atomic write size of 64 bits. For metadata structures, file system invariants can be used to do in-place updates. For example, when adding an entry in a directory file, the file system can find an unoccupied (i.e., zeroed) directory entry, write the name of the new entry, and then write the entry's number. Since an entry is only considered valid when it contains a non-zero inumber, this final write commits the change to the file system. Similarly, modes are not considered valid until a directory entry points to them, so modes that are not yet live can be modified in-place. For example, the file system may be writing to a "dead" inode in preparation for creating a directory entry that points to the "dead" inode.

Figure 6:
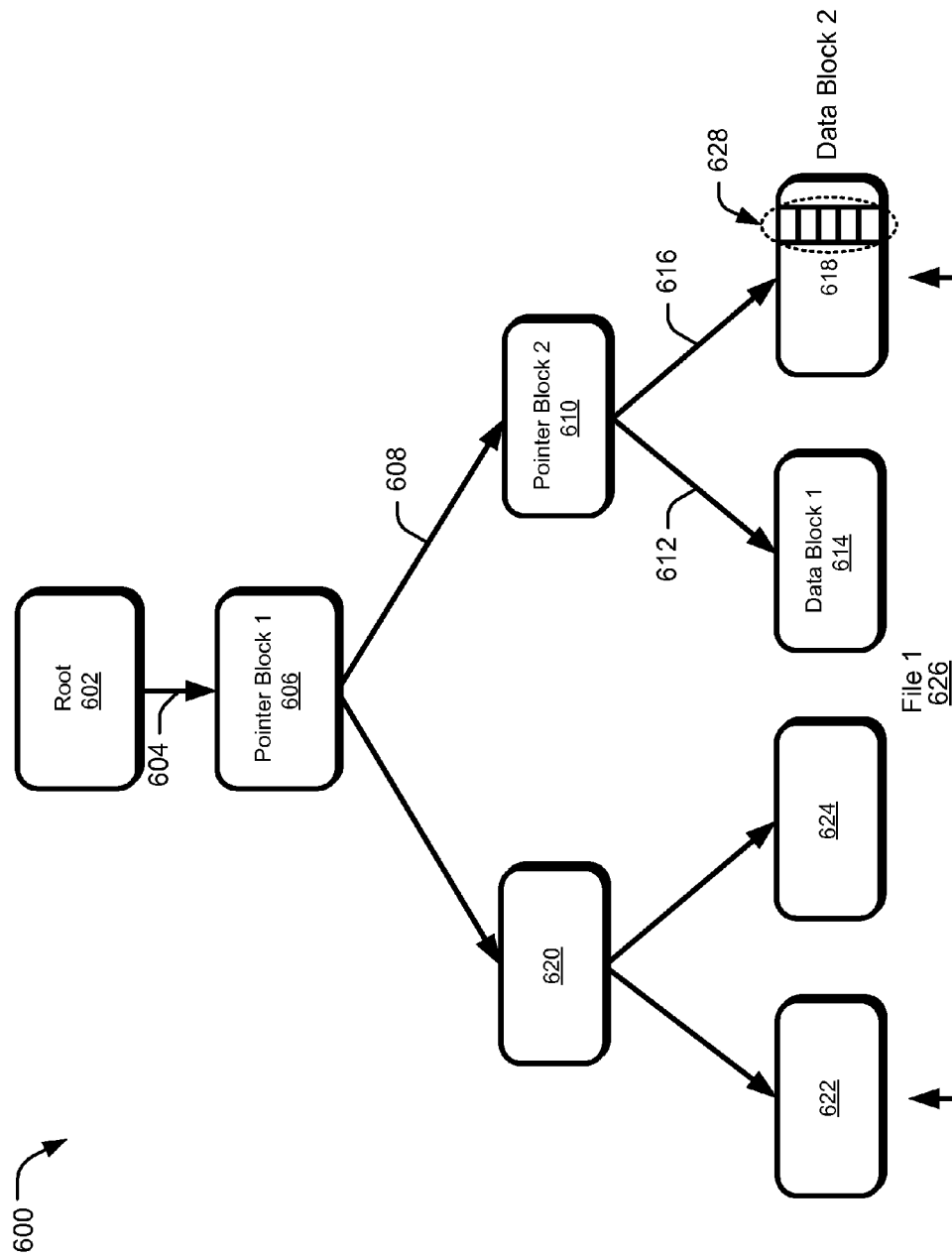
FIG. 6 is a block diagram illustrating an example of in-place append.

FIG. 6 is an exemplary implementation 600 of an in-place update. In one embodiment, the non-volatile memory component 110 (FIG. 1) contains file data stored in a tree structure, with a root 602 at the beginning of the tree. The root 602 has a root pointer 604 that points to pointer block 1 606. Pointer block 1 606 contains multiple pointers, including pointer 608, which points to pointer block 2 610. Pointer block 2 610 has pointer 1 612 which points to data block 1 614 and pointer 2 616 which points to data block 2 618. Other branches of the tree may contain additional pointers and data blocks. For example, pointer block 3 620, data block 3 622, and data block 4 624 are in another branch. The data for File 1 626 consists of the data stored in data blocks 622, 624, 614, and 618. The size of modified data 628 is less than or equal to the maximum size that can be atomically written. A particular amount of data can be atomically written if there is a guarantee that the entire write operation will either succeed or fail (i.e. 8 bits, 64 bits, 8 bytes). Since modified data 628 is changed through an atomic write, no other modifications to the tree structure are needed when the changes are made to Modified Data 628.

Updating Persistent Data Via In-Place Appends

In-place appends take advantage of the file size variable that accompanies the root pointer for each file. Since all data beyond the file size is ignored, the file system can safely write to these locations in-place, and once all of the data has been written, the file system can atomically update the file size to extend the valid data range.

Figure 7:
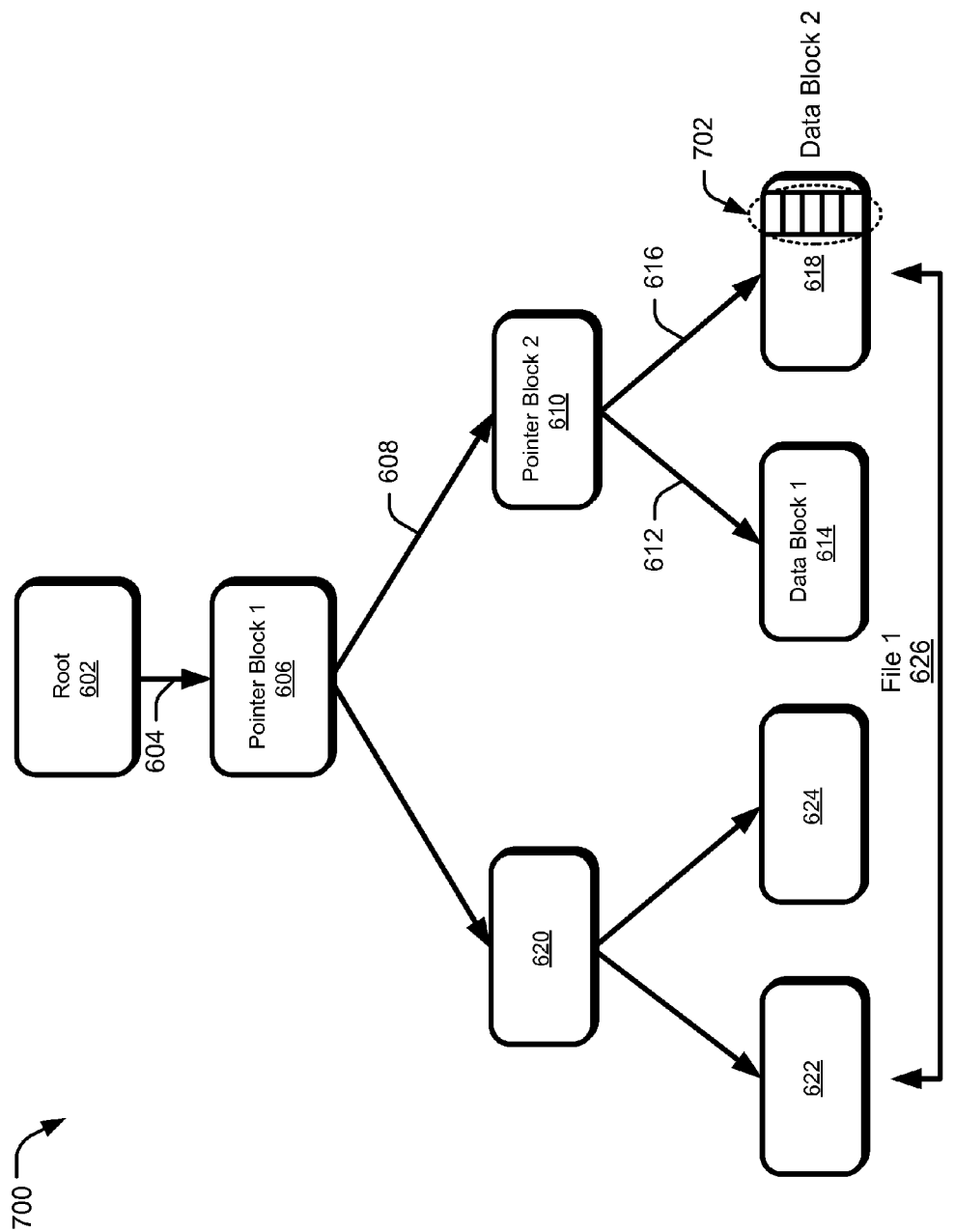
FIG. 7 is a block diagram illustrating an example of atomically updating a pointer to a copied and modified data block.

FIG. 7 is an exemplary implementation 700 of an in-place append to a file with root pointer 602. In one embodiment, File 1 626 consists of data blocks 622, 624, 614, and 618. Pointer block 2 610 has pointer 2 616 which points to data block 2 618 and pointer 1 612 points to data block 1 514. Appended data 702 is added to data block 2 618, which is part of File 1 626. A file size variable accompanies the file to the root pointer 602. Once all of the appended data 702 is written to data block 2 618, the file size variable is atomically updated to a larger file size. This extends the valid data range. Any data beyond the file size is ignored. Therefore, if a crash occurs before the file size is updated or while the append is in progress, the appended data is simply ignored.

Updating Persistent Data Via Partial Copy-On-Write

Partial copy-on-write is a technique for updating persistent data, allowing an atomic update to an arbitrarily large portion of the file system. In this approach, the file system performs a copy-on-write on all portions of the tree that will be affected by the write operation, up to the lowest point at which a change can be committed with a single write.

Figure 8:
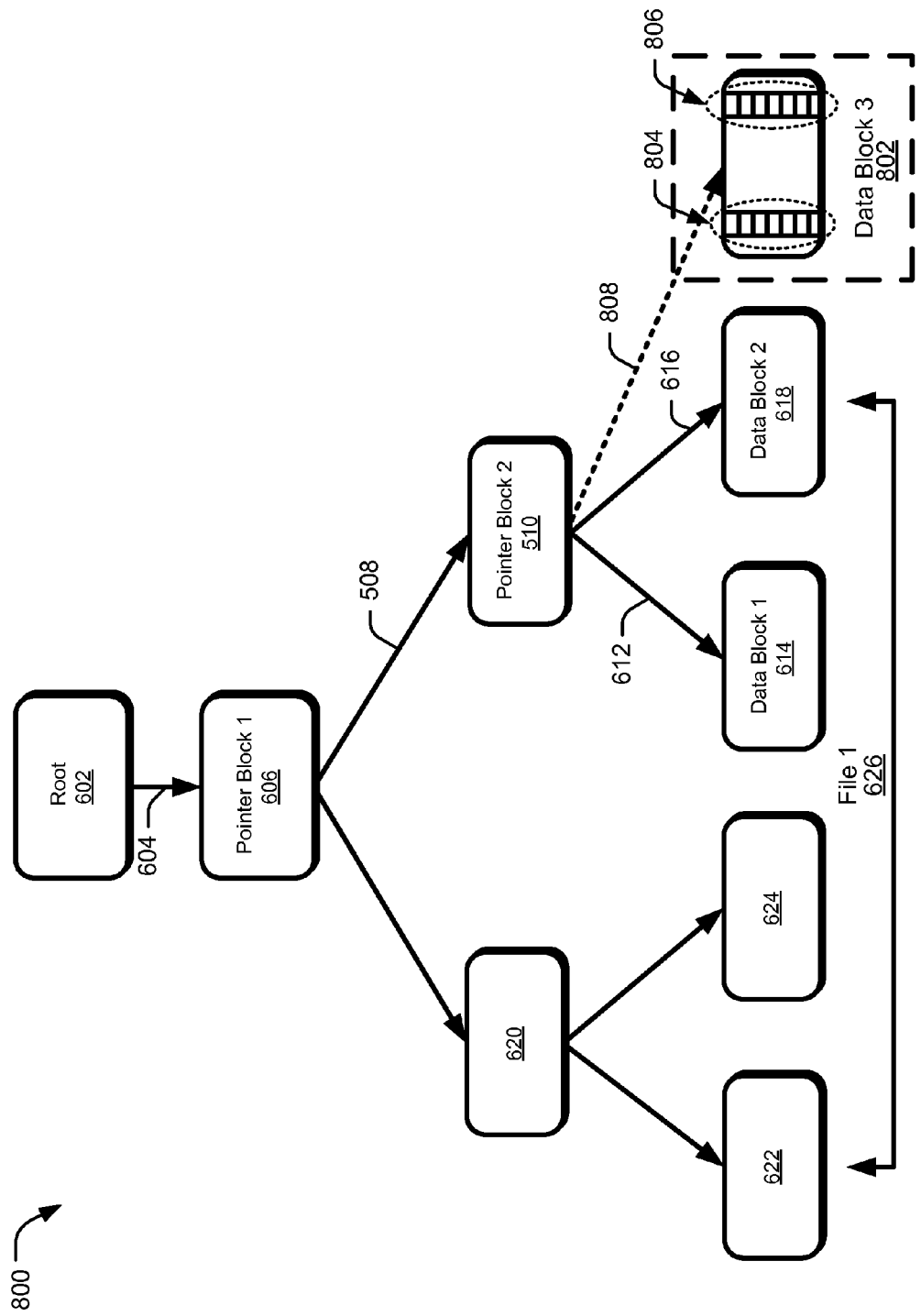
FIG. 8 is a block diagram illustrating an example of a partial copy-on write.

FIG. 8 is an exemplary implementation 800 of partial copy-on write to a file with root pointer 602. File 1 626 consists of data blocks 622, 624, 614, and 618. Pointer block 2 610 includes pointer 2 616, which points to data block 2 618. When data block 2 618 needs to be modified, data block 3 802 is created by copying data block 2 618 to a newly-allocated location in non-volatile memory. In certain embodiments, only some of the data in data block 2 618 is copied (i.e., data that will not be modified). As shown, data block 3 802 is changed in two areas: modified data 1 804 and modified data 2 806. After the data in data block 3 802 is updated, pointer 2 616 is atomically updated to pointer 3 808, such that pointer block 2 610 points to data block 3 802 instead of data block 2 618. If a crash occurs before pointer 2 616 is updated, pointer block 2 610 will continue to point to data block 2 618. Therefore, pointer 2 616 will not point to "dirty data" if a crash occurs.

Figure 9:
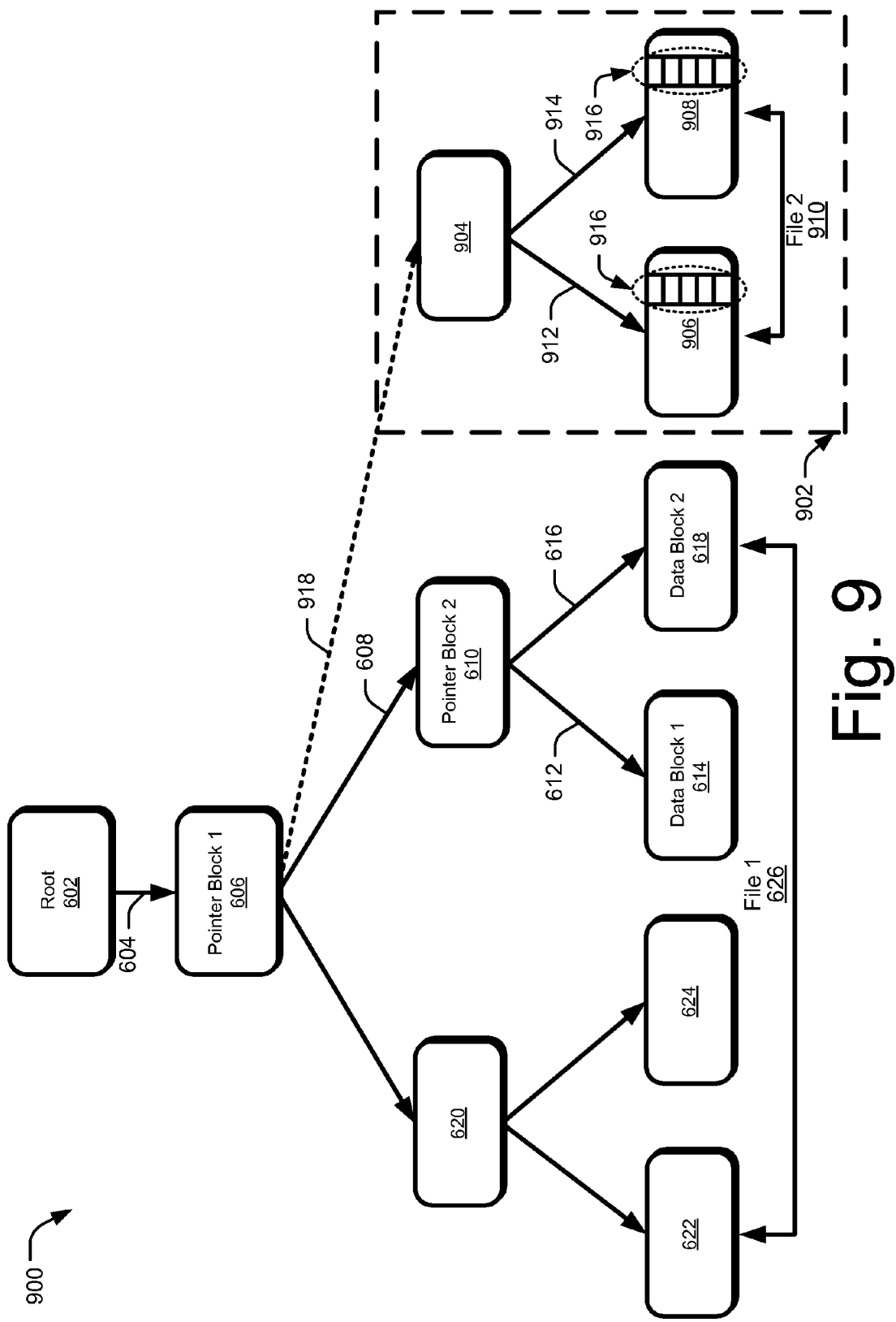
FIG. 9 is a block diagram illustrating an example of a partial copy-on-write involving multiple data blocks.

FIG. 9 is an exemplary implementation 900 of a partial copy-on-write involving multiple data blocks. File 1 626 consists of data blocks 622, 624, 614, and 618. Pointer block 1 606 includes pointer 608, which points to pointer block 2 610. Pointer block 2 610 includes pointer 1 612, which points to data block 1 614 and pointer 2 616, which points to data block 2 618. When data is modified in both data block 1 614 and data block 2 618, a Subtree 902 is created by copying pointer block 2 610 to pointer block 3 904, copying data block 1 614 to data block 3 906, and copying data block 2 618 to data block 4 908, where data blocks 904, 906, and 908 are newly-allocated blocks in non-volatile memory. In this example, a user wants to write data that spans both the third and fourth data blocks of the file. To do so, the file system allocates new space in the non-volatile memory component 110 for new blocks, copies any existing data that will not be overwritten (e.g., the beginning of the third data block), and then updates the new blocks as appropriate. The file system also copies and updates any pointer blocks that cannot be updated atomically.

Pointer 3 912 points to data block 3 906 and pointer 4 914 points to data block 4 908. Once the file system has created these data blocks and copied any data that will not be modified, it writes modified data 916 to the new blocks. In addition, it writes modified pointers 912 and 914 to block 904, so that block 904 now points to blocks 906 and 908 instead of 614 and 618. There may still be pointers in pointer block 904 that point to old data blocks (not shown in this example), as long as those data blocks have not been modified. After modified data 916 has been updated in the Subtree 902, pointer A 608 is atomically updated to pointer B 918, so that pointer block 1 606 points to pointer block 3 904 instead of pointer block 2 610. If a crash occurs before pointer A 608 is updated, pointer A 608 will continue to point to pointer block 2 610. Only when all of the updates in Subtree 902 are complete does the file system commit the change by performing an atomic update of the pointer A 608. Therefore, pointer block 1 606 will not point to "dirty data" if a crash occurs.

Updating Persistent Data

Figure 10:
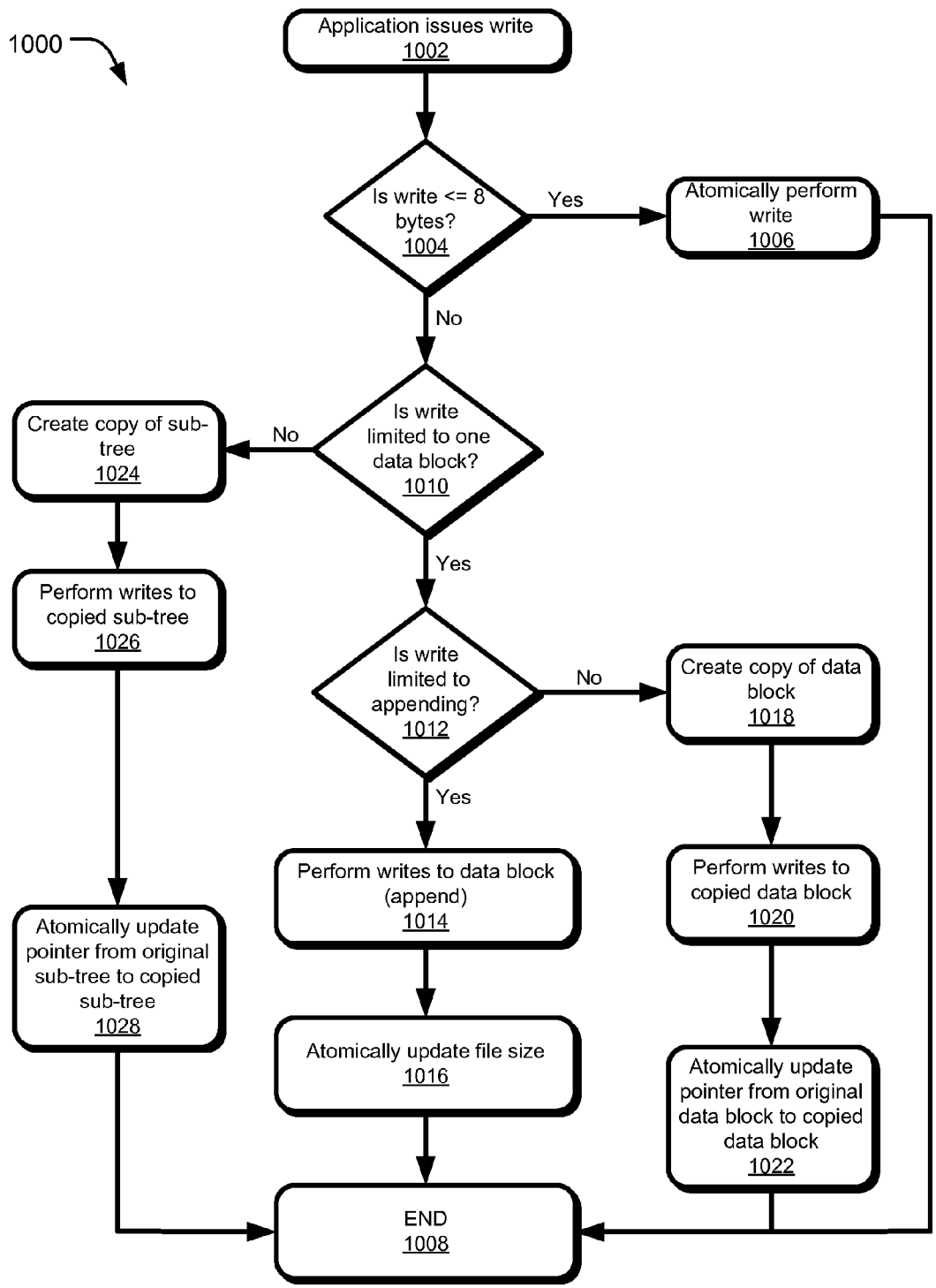
FIG. 10 is a flow diagram of a method for atomically updating a data structure.

FIG. 10 is a flow diagram of an exemplary process 1000 for atomically updating a data structure. Process 1000 may be implemented by CPU component 102 of computing device architecture 100. Process 1000 is illustrated as a collection of blocks in a logical flow diagram, which represents a sequence of operations that can be implemented in hardware, software, or a combination thereof. In the context of software, the blocks represent computer instructions that, when executed by one or more processors, perform the recited operations.

The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the process can be implemented in any suitable hardware, software, firmware, or a combination thereof, without departing from the scope of the invention.

At step 1002, an application issues a write command. In one embodiment, e.g., 8 bytes of data can be written atomically. Other embodiments may atomically write smaller or larger amounts of data. At step 1004, if the amount of data to be written is less than or equal to 8 bytes, then an atomic write is issued at step 1006. The method 1000 then ends at step 1008.

At step 1002, if the amount of data to be written is more than 8 bytes, then at step 1010 the file system determines if the write is limited to one data block. If so, then at step 1012 the file system determines if the write is limited to appending data to a file. If so, then at step 1014 the files system appends data to the data block. At step 1016, after the data is appended to the data block, the file system atomically updates a file size variable associated with the appended file. The method 1000 then ends at step 1008.

At step 1012, if the write is not limited to simply appending data, then at step 1018, a copy of the data block is created. In some embodiments, only data that will remain unchanged is copied into the newly created data block. At step 1020, the file system writes to the data block. At step 1022, after all writes to the data block are complete, the file system atomically updates the pointer from the original data block to the new data block. The method 1000 then ends at step 1008.

At step 1010, if the write is not limited to one data block, then at step 1024 the file system creates a copy of the subtree that contains data to be modified. At step 1026, the file system writes data to the data blocks. At step 1028, after all writes to the data blocks are complete, the file system atomically updates the pointer from the original subtree to the new subtree. The method 1000 then ends at step 1008.

Using Non-Volatile Memory with Volatile Data Structures

In an embodiment, for speed and convenience a number of data structures may be maintained in volatile memory. First, the file system may have a list of free blocks of the non-volatile memory component 110 as well as freed and allocated inumbers. Because these data structures are stored in volatile memory (i.e., the DRAM component 112), they are reconstructed from the file system at every boot; however, this can be done in a fraction of a second, even on a moderately full file system. Storing this data in the DRAM component 112 provides that there is no need to worry about consistency guarantees between the free list and the file system itself.

Second, the file system stores a list of freed and allocated blocks from an in-flight copy-on-write operation. For example, while performing a write, the file system will keep track of any newly allocated blocks (i.e., FIG. 9, block 904, block 906, block 908) as well as any blocks that will need to be freed if the operation succeeds (i.e., FIG. 9, block 610, block 614, block 618). When the operation is complete, the file system iterates over either the freed list or the allocated list (depending on the success of the operation) and adds these blocks to the global free list. Because commits are atomic, this data never needs to be stored in NVM 110 or reconstructed.

Third, the file system stores a cache of directory entries from each directory that has been opened by the user. Each directory entry in the cache is stored simultaneously in a list and a hash table so that the file system can support quick, ordered directory listings as well as quick individual name lookups. Any updates to directories are immediately reflected to the non-volatile memory component 110 as well.

Because these data structures are only found in the DRAM component 112, the file system need not use atomic writes to update them; rather, they are synchronized with the file system updates using only conventional locks. An alternate design might place some of these structures in the non-volatile memory component 110 directly.

Non-Volatile Memory File System Operations

This section presents details of an embodiment of a file system implementation. Since files in the file system use the same basic tree data structure, the implementation has a core set of routines, called the crawler, which is designed to traverse these trees and perform reads and writes. To implement a file system operation, the crawler is given a root pointer 602, the height of the tree, a range of file offsets, and a callback function. Because the system can compute the file offsets spanned by each pointer, the crawler only needs to visit the pointers included in the specified range of offsets. Once the crawler gets to the leaf nodes, it will invoke the callback with the appropriate addresses.

The crawler is responsible for updating the tree height and any internal pointers. To update the tree height, the crawler looks to see if the requested file offsets are beyond the offsets spanned by the current file tree. If so, it increases the height of the tree by an appropriate amount. Each increase in the height of the tree is a simple operation: the crawler allocates a new pointer block, sets the first pointer in this block to the old tree, and then sets the root pointer 602 to point to this new block (along with the new height, encoded as low-order bits). These updates can all be performed atomically, independent of the write operation that is about to be performed.

At leaf nodes, the crawler invokes a callback, and if the callback wishes to perform a copy-on-write operation, it will allocate a new block, perform any necessary updates, and return the pointer to that new block. The crawler then updates any internal nodes (i.e., pointer blocks 514) as appropriate. If no modifications are made by the callbacks, the crawler returns the existing pointer block untouched. If only one pointer is modified by the callbacks, then the crawler commits that operation in-place. If more than one pointer is modified, the crawler makes a complete copy of that pointer block, deferring the commit to a higher level in the tree.

Sometimes only copy-on-write is allowed. For example, when a write operation proceeds down two branches of the tree, neither branch is allowed to commit in-place, since any commits need to happen at a common ancestor. This case also arises when the user performs a write that will update existing data and extend the end of the file. Because the file system needs to update both the file size and the root pointer 602 atomically, the file system needs to perform a copy-on-write on the inode 516 itself, and the file system needs to disallow in-place commits during the file write.

Because the file system has two levels of tree data structures (i.e., the inode file 502 and everything below it), many operations invoke the crawler twice: once to find an inode 516 in the inode file 502, and a second time to perform some operation on that inode 516. The callback for the top level crawl invokes the crawler a second time for the bottom-level file. Copy-on-writes can be propagated upward through both invocations of the crawler.

In an embodiment, the file system is implemented in the Microsoft Windows® Operating System Driver Model, but the following presents a simplified view of these operations. When a file is opened, the file system operation parses the path and uses the directory entry cache to look up the target file or directory. Because the directory entry cache stores complete directory information in the DRAM component 112, this operation only needs to access the non-volatile memory component 110 if a directory is being opened for the first time.

If the file does not exist and a new file is created, the file system claims a new inumber from the free list and then writes a new inode to a block 516 of the inode file 502 at the appropriate offset. Because modes within blocks 516 are invalid unless referenced by a directory entry, these updates can be performed in-place. Once the inode 516 is ready, the file system writes a new directory entry into the parent directory. Once again, this update can be done in-place, because the directory entry is not valid until a nonzero inumber is written to the appropriate field. Finally, the file system updates the directory entry cache in the DRAM component 112.

It is noted that this entire operation can effectively be performed with in-place updates to metadata; thus, file creation is consistent, synchronous, and extremely fast. A few extra writes may be required when the inode file 502 or directory file 518 is extended.

When a file is read, the file system invokes the crawler on the appropriate range of the file. The read callback copies data from the data block 520 into a user-supplied buffer. No updates to file system data may be required, although the access time can be updated with an in-place atomic write.

When a file is written, the file system may perform a copy-on-write of the inode 516 itself, such that the operation uses a two-level crawl. The top level crawl operates on the inode file 502 and locates the target file's inode 516. Then the file system invokes the write crawler on the appropriate range of this file. The write callback determines whether an in-place write is possible, and if so, the write callback performs that write. If not, the write callback makes a copy of the block, updates the copy, and returns the copy to the crawler. The crawler then updates the internal nodes using the logic described above.

The file system atomically updates either the file size or the root pointer 602 within the inode 516 as necessary. If both are updated, then a copy-on-write is performed on the inode block 516 itself, and the new version is returned to the inode file crawler to be committed higher up in the tree. For efficiency, the file system updates the file modification time separately. If atomicity is required, the file system can force a copy-on-write on every write operation.

When a directory is read, the file system loads the directory into the directory entry cache, if the directory is not already cached. The file system searches for the requested name, looks up all relevant modes in the inode file 502 from the non-volatile memory component 110, and fills the application's buffer. Loading a directory into the directory entry cache may also be performed with the crawler. The crawler is invoked with the entire file range, so that the crawler receives callbacks for the entire directory. At each data block 518, the crawler reads the relevant directory entries and enters them in the cache.

When a file or directory is closed the file system checks to see whether the file or directory has been marked for deletions by a separate call not shown. If so, the file system deletes the file or directory by crawling the directory file to the location of the directory entry and writing a zero to the inumber field in-place. Because a zero inumber indicates an invalid directory entry, this atomic write instantly invalidates both the directory entry and the inode 516 to which it refers. Finally, the file system updates the volatile data structures, including the free block list and the free inumber list.

This implementation exhibits many of the benefits of redesigning a file system for use on the non-volatile memory component 110 (FIG. 1). Through use of byte-level accesses, the file system can perform in-place updates for a large number of operations, and through use of an atomic write, the file system can provide strong consistency and safety guarantees for arbitrarily large changes to the file system. On a system that requires block-based updates, the file system would not be able to achieve the same combination of high performance and strong guarantees.

In certain embodiments, file write times are not updated atomically with respect to the write itself, because doing so would require all write operations to be propagated up to the inode itself using copy-on-write. Therefore, if a crash occurs between the write and the timestamp update, it is possible that the timestamp will not be up to date. This problem could be addressed by implementing a wider atomic write primitive or by squeezing the modification time and the root pointer into a single 64-bit value.

Instant Boot

An application enabled by non-volatile, byte-addressable memory is "instant boot." Operating systems may take several minutes to boot from a completely powered-down state. For example, certain operating systems offer "sleep" and "hibernate" features for partially shutting down a computer. In sleep mode, an operating system can power down all devices except for the DRAM component 112, and in hibernate mode, the contents of the DRAM component 112 are copied to the hard drive 116 so that power can be turned off completely. Hibernating saves more power, but also takes more time to enter and leave the hibernating state. Fundamentally, startup may be a problem that is I/O bound to persistent storage (i.e., hard drive 116). A faster hard drive 116 results in faster boot time, but data structures and file system objects may be to be copied across a bus and into the DRAM component 112 to be made useful.

A simple form of instant boot may keep operating system data structures in PRAM 110 instead of the DRAM component 112. In this case, sleep mode would not require any power. Therefore, such method provides the power savings of hibernate mode with the speed of sleep mode. Existing operating systems may include all the necessary code for managing hardware devices during sleep mode.

A second form of instant boot may use the non-volatile memory component 110 as a backing store for operating system data state. The file system can take a snapshot of the DRAM component 112 after the computer (i.e., computer device architecture 100) has booted and store this snapshot in the non-volatile memory component 110. On the next boot, this snapshot can be copied from the non-volatile memory component 110 to the DRAM component 112 in order to skip past portions of the boot sequence. Components and devices should be placed into the correct state, and update performed on the saved memory image to account for changes in time, hardware configuration, and etc. It is noted that the specific operating system data structures required to support this scenario depends upon the operating system.

Instant boot benefits in two ways from a cache hierarchy design. First, the time to read OS data structures from the non-volatile memory component 110 is reduced, because the non-volatile memory component 110 might be faster than other storage mediums, and because the non-volatile memory component 110 is located closer to the CPU component 104. Second, since the non-volatile memory component 110 is byte addressable from the CPU component 104, OS data structures do not need to be marshaled before they are written, since they must be when they are written to other mediums such as disk. Pointers can be preserved in the non-volatile memory component 110, and then restored when they are read back in the DRAM component 112 at the time of boot.

Application Checkpoints

The non-volatile memory component 110 opens up a new set of uses to applications, including checkpointing application state. Applications could reflect the state of the application (e.g., heap, stack, registers) directly to the non-volatile memory component 110. Applications could use these checkpoints for reliability and security.

Extending Storage Capacity with Traditional Storage Media

Although the non-volatile memory component 110 provides many advantages over hard drives 116 or solid-state drives for storing file system data, in certain cases, such a use maybe more expensive per byte than these other media. Therefore, an approach to this problem may be to store metadata and small files in the non-volatile memory component 110 based file system. For larger files that do not fit within the non-volatile memory component 110 based file system, the file system can store a symbolic link to a file stored on a hard drive 116 or solid-state drive using a traditional file system such as NTFS. The operating system can implement one of many policies for moving files between the non-volatile memory component 110 based and disk-based file systems in order to speed up access to commonly-used files while providing the high capacity of a hard drive 116.

The non-volatile memory component 110 based file system may be periodically copied to the hard drive 116 itself so that recovery of the full file system can be performed if only the hard drive 116 is removed from the system.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. A system comprising:
one or more processors;
memory, communicatively coupled to the one or more processors, storing instructions that, when executed by the one or more processors, configure the one or more processors to perform acts comprising:
receiving a first write operation to write at least a first set of data to a first portion of a non-volatile memory;
determining whether the first set of data can be written atomically;
in response to determining that the first set of data can be written atomically, atomically writing the first set of data to the first portion of the non-volatile memory; else
in response to determining that the first set of data cannot be written atomically:
copying the first set of data to a second portion of the non-volatile memory,
writing metadata associated with the first set of data to a third portion of the non-volatile memory, and
atomically committing the third portion of the non-volatile memory.

2. The system of claim 1, wherein atomically committing the third portion of non-volatile memory comprises changing a pointer.

3. The system of claim 1, wherein the non-volatile memory comprises file data organized as a tree structure.

4. The system of claim 1, wherein a file system reads and writes data structures directly from and to the non-volatile memory.

5. The system of claim 1, wherein a state of an application is stored into the non-volatile memory.

6. The system of claim 1, wherein a first file system for the non-volatile memory operates in conjunction with a second file system for persistent storage such as a hard disk or solid-state disk.

7. The system of claim 1, wherein upon receiving the first write operation to write at least the first set of data to the first portion of the non-volatile memory, the acts further comprise:
receiving a second write operation to write at least a second set of data to the second portion of the non-volatile memory; and
atomically writing the first set of data and atomically writing the second set of data in a same order as the first write operation and the second write operation were received.

8. A method comprising:
under control of one or more processors configured with executable instructions:
receiving a first write operation to write at least a first set of data to a first portion of a non-volatile memory;
determining whether the first set of data can be written atomically;
in response to determining that the first set of data can be written atomically, atomically writing the first set of data to the first portion of non-volatile memory; else
in response to determining that the first set of data cannot be written atomically:
copying the first set of data to a second portion of the non-volatile memory,
writing metadata associated with the first set of data to a third portion of the non-volatile memory, and
atomically committing the third portion of the non-volatile memory.

9. The method of claim 8, wherein atomically committing the third portion of non-volatile memory comprises changing a pointer.

10. The method of claim 8, wherein the non-volatile memory comprises file data organized as a tree structure.

11. The method of claim 8, wherein a file system reads and writes data structures directly from and to the non-volatile memory.

12. The method of claim 8, wherein an operating system saves data into non-volatile memory in order to bypass at least a portion of a boot sequence.

13. The method of claim 8, wherein a state of an application is stored into the non-volatile memory.

14. The method of claim 8, wherein a first file system for the non-volatile memory operates in conjunction with a second file system for persistent storage.

15. The method of claim 8, wherein upon receiving the first write operation to write at least the first set of data to the first portion of the non-volatile memory, the method further comprises:
receiving a second write operation to write at least a second set of data to the second portion of the non-volatile memory; and
atomically writing the first set of data and atomically writing the second set of data in a same order as the first write operation and the second write operation were received.

16. A storage device having thereon a data structure, comprising:
a tree that stores file data and metadata associated with the file data in non-volatile memory, wherein at least a portion of the file data in the tree is capable of being atomically updated in the non-volatile memory without making any other modifications to the tree.

17. The storage device of claim 16, wherein the tree comprises page-sized blocks comprising at least one of pointers, user data, or file system metadata.

18. The storage device of claim 16, wherein the tree comprises at least one pointer to a data block that is capable of being atomically updated.

19. The storage device of claim 16, wherein the tree comprises files, wherein each file comprises at least a portion of a data block.

20. The storage device of claim 16, wherein the tree comprises at least one root pointer that stores a value of a file size, wherein the value is capable of being atomically updated.

* * * * *